United States Patent [19]

Bennin

[11] Patent Number: 5,598,307

[45] Date of Patent: Jan. 28, 1997

[54] INTEGRATED GIMBAL SUSPENSION ASSEMBLY

[75] Inventor: Jeffry S. Bennin, Hutchinson, Minn.

[73] Assignee: Hutchinson Technology Inc., Hutchinson, Minn.

[21] Appl. No.: 478,396

[22] Filed: Jun. 7, 1995

Related U.S. Application Data

[63] Continuation-in-part of Ser. No. 227,960, Apr. 15, 1994, Pat. No. 5,491,597, Ser. No. 227,978, Apr. 15, 1994, and Ser. No. 249,117, May 25, 1994.

[51] Int. Cl.$^6$ .................................................. G11B 021/16
[52] U.S. Cl. .......................................................... 360/104
[58] Field of Search .................................. 360/104, 105, 360/108

[56] References Cited

U.S. PATENT DOCUMENTS

| | | | |
|---|---|---|---|
| 4,543,295 | 9/1985 | St. Clair et al. | 428/458 |
| 4,616,279 | 10/1986 | Poorman | 360/103 |
| 4,645,280 | 2/1987 | Gordon et al. | 339/17 F |
| 4,670,804 | 6/1987 | Kant et al. | 360/102 |
| 4,761,699 | 8/1988 | Ainslie et al. | 360/103 |
| 4,789,914 | 12/1988 | Ainslie et al. | 360/103 |
| 4,792,875 | 12/1988 | Ohdaira | 360/104 |
| 4,801,765 | 1/1989 | Moyer et al. | 29/827 |
| 4,811,143 | 3/1989 | Ohashi et al. | 360/105 |
| 4,823,217 | 4/1989 | Kato et al. | 360/104 |
| 4,827,376 | 5/1989 | Voss | 361/388 |
| 4,839,232 | 6/1989 | Morita et al. | 428/473.5 |
| 4,853,811 | 8/1989 | Brooks, Jr. et al. | 360/103 |
| 4,884,155 | 11/1989 | Spash | 360/105 |
| 4,975,795 | 12/1990 | Spash | 360/104 |
| 4,991,045 | 2/1991 | Oberg | 360/104 |
| 4,996,623 | 2/1991 | Erpelding et al. | 360/104 |
| 5,001,583 | 3/1991 | Matsuzaki | 360/104 |
| 5,003,420 | 3/1991 | Hinlein | 360/104 |
| 5,006,946 | 4/1991 | Matsuzaki | 360/104 |
| 5,012,368 | 4/1991 | Bosier et al. | 360/104 |
| 5,027,239 | 6/1991 | Hagen | 360/104 |
| 5,052,105 | 10/1991 | Mische et al. | 29/883 |
| 5,055,969 | 10/1991 | Putnam | 361/398 |
| 5,068,759 | 11/1991 | Matsuzaki | 360/103 |
| 5,074,029 | 12/1991 | Brooks, Jr. et al. | 29/603 |
| 5,103,359 | 4/1992 | Marazzo | 360/104 |
| 5,111,351 | 5/1992 | Hamilton | 360/104 |
| 5,121,273 | 6/1992 | Slezak | 360/104 |
| 5,124,864 | 6/1992 | Matsuzaki | 360/104 |
| 5,166,845 | 11/1992 | Thompson et al. | 360/103 |
| 5,249,092 | 9/1993 | Russell-Smith et al. | 360/104 |
| 5,274,911 | 1/1994 | Toro | 29/827 |
| 5,333,085 | 7/1994 | Prentice et al. | 360/104 |
| 5,391,842 | 2/1995 | Bennin et al. | 360/104 |

FOREIGN PATENT DOCUMENTS

| | | |
|---|---|---|
| 1329261 | 5/1993 | Canada. |
| 0599669A2 | 1/1994 | European Pat. Off. |
| 0599669 | 1/1994 | European Pat. Off. |
| 53-19015 | 2/1978 | Japan. |
| 53-30310 | 3/1978 | Japan. |
| 53-74414 | 7/1978 | Japan. |
| 57-167162 | 10/1982 | Japan. |
| 60-246015A | 12/1985 | Japan. |
| 4146516 | 5/1992 | Japan. |
| 4-219618 | 10/1992 | Japan. |
| WO93/15593 | 8/1993 | WIPO ............................. H05K 1/00 |

OTHER PUBLICATIONS

Reidenbach, IBM Technical Disclosure Bulletin, vol. 22, No. 4, Sep. 1979, pp. 1602–1603.

Hetka, et al., "Flexible Silicon Interconnects for Microelectromechanical Systems", 1991.

International Conference on Solid–State Sensors and Actuators, Digest of Techincal Papers, pp. 764–767.

*Primary Examiner*—John H. Wolff
*Attorney, Agent, or Firm*—Faegre & Benson

[57] ABSTRACT

A magnetic read write head suspension with integrated lead traces on the load beam act as the longitudinal support arms for a cross bar and tongue of a T flexure or Watrous type flexure.

6 Claims, 3 Drawing Sheets

INTEGRATED GIMBAL SUSPENSION ASSEMBLY

The present application is a continuation-in-part of commonly assigned applications entitled GIMBAL INTERCONNECT AND ELECTRICAL INTERCONNECT ASSEMBLY, Ser. No. 08/227,960, now U.S. Pat. No. 5,491,597 and ELECTRICAL TRACE INTERCONNECT ASSEMBLY, Ser. No. 08/227,978, both filed on Apr. 15, 1994 AND LAMINATED STRUCTURES FOR A DISK DRIVE SUSPENSION ASSEMBLY, Ser. No. 08/249,117, filed on May 25, 1994.

BACKGROUND OF THE INVENTION

Suspension assemblies are spring structures in disk drives that position a read/write head assembly nanometers away from the rapidly spinning surface of a rotatable disk or other data storage device. The suspension assembly presses the head toward the disk surface with a precise force applied in a precisely determined location. The head assembly "flies" over the irregular (at this scale) surface of the disk at a height established by the equilibrium of the suspension assembly downward force and the increasing lift force of the air stream generated by the spinning disk as the head nears the disk.

A head suspension assembly (HSA) includes the suspension assembly, the head assembly, and an electrical interconnect assembly. The interconnect assembly is a collection of elements designed to conduct data signals to and from the head assembly. HSAs are used in magnetic hard disk drives, the most common today, or other type of drives such as optical disk drives.

The suspension assembly includes two spring structures, a load beam and a gimbal, each a carefully balanced combination of rigid regions and flexible spring regions. The load beam is a resilient spring plate designed to provide lateral stiffness and calibrated to apply the necessary load on the head assembly. The gimbal is a spring positioned at the distal end of the suspension assembly and of the load beam. The gimbal holds the head assembly at an appropriate orientation (flying attitude) and at a constant distance over the contours of the disk, even if the load beam flexes and twists. The head assembly is attached to the gimbal and includes a "head," a highly sensitive read/write transducer, attached to an air bearing slider. The head assembly also includes electrical terminals configured for interconnection to the interconnect assembly for receiving and relaying data (read and write signals).

A magnetic read/write transducer transforms electrical write signals into small magnetic fields. The magnetic fields magnetize domain patterns on a magnetic disk. The order of the magnetic fields and their subsequent orientation defines a bit code representing the stored data. A magnetic read transducer "reads" these domains fields as it flies over them and converts them back into electrical signals.

The suspension assembly can be attached at its proximal end to a rigid arm or directly to a linear or rotary motion actuator. The actuator rapidly moves (and then abruptly stops) the HSA over any radial position on the disk. Such radial HSA movement and the rotation of the disk allow the head to quickly reach every location on the disk surface. The rapid stop and go movement causes very high stresses on the HSA.

The closer the head assembly can fly to the surface of a magnetic disk, the more densely information can be stored (the strength of a magnetic field varies proportionally to the square of the flying distance, thus the smaller the head's flying clearance, the smaller the magnetic "spot" of information can be). Manufacturers of disk drives strive to reach flying clearances close to 100 nanometers=0.1 micrometers (a human hair is about 100 micrometers thick). However, the head assembly must not touch the disk ("crash"), since an impact with the spinning disk (rotating at about 3600 rpm or faster) can destroy both the head, the surface of the disk, and the stored data.

Amplifying and control electronic circuits process, send, and receive the data signals to and from the head assembly. Signal transmission requires conductors between the dynamic "flying" head and the circuitry. Traditional head assemblies complete a read/write circuit loop with two conductors, usually copper wires encapsulated in a plastic sheeting. Newer magneto-resistance head assemblies require four or more independent conductors. The interconnect assembly includes the conductors and accompanying insulators and connectors.

Designers and manufacturers of HSAs face competing and limiting design considerations. During operation, the suspension assembly should be free of unpredictable loads and biases which alter the exact positioning of the head assembly. The suspension assembly should respond instantaneously to variations in the surface topology of a disk. Alterations to the flying height of the head can significantly affect data density and accuracy and even destroy the system in a crash.

Rigidity and stiffness increase in relation to the third power of cross-sectional thickness. To respond to air stream changes and to hold the flying head at the appropriate orientation, suspension assemblies are very thin and flexible, specially around the sensitive spring and gimbal areas. Interconnect assembly conductors have a large effect on suspension assembly performance. Conductor stiffness alone greatly affects the rigidity of the spring regions and flight performance. A standard conductor placed atop of a thin suspension can more than double a spring region's stiffness and detract from the ability of the spring region to adjust to variations in the surface of the disk, vibrations, and movement. The effect of the conductors on a gimbal region, the thinnest and most delicate spring in the suspension assembly, is even more pronounced. Conductors placed over spring regions must not plastically deform (become permanently bent) when the spring regions flex, since such deformation hinders the return of the spring to its normal position and applies a load on the suspension assembly.

The ideal HSA comprises components low in mass. Excessive inertial momentum caused by excessive mass can cause overshoot errors. Overshoot errors occur when momentum carries the whole HSA past the intended stopping point during positioning movement. Low-in-mass HSAs are also easier to move, resulting in power savings in multiple platter disk drives.

The manufacture of HSAs, like that of any commercial product, must be efficient. Reduction of manufacturing steps is desired. Damaged or misaligned components introduce biases and loads and drastically diminish the manufacturing useful output yield. Complex shaping and mounting processes are costly and decrease the reliability of the whole HSA manufacturing process.

To avoid defects and unpredictable loads and biases, exacting tolerances are necessary. During the HSA manufacturing and assembling process, the buildup of deviations from tolerance limits causes planar deviations that can affect the flying attitude of the head assembly. The parameters of static roll and static pitch torque in the final HSA result from these inherent manufacturing and assembly tolerance build-ups.

Mounting and placement of current interconnect assemblies is usually done by hand. Hand mounting is imprecise and costly. Precise conductor placement is especially critical in the delicate gimbal region. As the industry transitions to smaller slider/transducer sizes to increase data storage density, limitations of the current interconnecting devices increase the potential for read/write errors and impose ceilings on data storage density.

Using current interconnect technology, workers bond two to five lengths of wire to the head assembly, using fixturing to manage the wires while adhesively bonding the head assembly to a stainless steel suspension. Next, the lengths of wire are shaped by hand, using tweezers and tooling assistance to form a service loop between the head assembly and the suspension assembly and to position the wire along a predetermined wire path on the suspension assembly. The wires are tacked to the suspension using adhesive or wire capture features formed into the suspension. Special care is taken to avoid pulling the service loop too tight or allowing it to remain too loose. A tight service loop places an unwanted torque on the slider causing flying attitude errors. Loose service loops may allow the wire to sag down and scrape on the spinning disk. Both conditions are catastrophic to drive performance. Through-out the process of handling the slider and wires there is a risk of damaging the wires or the delicate load beam and gimbal. Load beams or gimbals accidentally bent during the manufacturing operations are scrapped. Often the head assembly also cannot be recovered, adding additional losses to the scrap pile.

SUMMARY

The present invention is new laminate structures for use in head suspension assemblies (HSAs) and a method to manufacture the laminate structures. The present laminate structures eliminate manual handling of conductors by integrating the manufacture of the interconnect assembly with that of the suspension assembly. Reduction in handling minimizes handling damage, thereby reducing damaged components and increasing manufacturing yields. Since the suspension assembly and the interconnect assembly are manufactured together, the variability of the alignment of the component (standard deviation) is minimal. Errors during mechanical performance are therefore reduced. Conductor geometry is always precise and no expensive and time-consuming manual fixturing during assembly is required. Less handling, less bent parts, and less assembly errors result in a more consistent fly height performance and more efficient manufacturing process.

The first step in the manufacture of the laminate structures is to providing a multi-layer laminate sheet. The sheet comprises a first layer of a metal spring material, an intermediate second layer of an electrically insulating, preferably adhesive, material, and a third layer of an electrically conductive material. The second layer only provides minimal spring characteristics to the laminate structure as a whole. The third layer can be a conductive spring material such as beryllium copper.

The second step is to create the layers, starting from the outside in. A method of producing the necessary patterns in the layers is by etching. The first layer is etched into the primary spring element. The third layer is etched to provide at least one trace, the trace including at least one elongated conductor configured for electrical coupling to a head assembly and for operation as an additional mechanical spring element in selected regions. The second layer provides panels shaped in conformance the areas of contact between the structure remaining after the etching to produce the elements of the first and the third layers.

To complete manufacture of a head suspension assembly (HSA), the traces of the laminate structure are electrically coupled to a head assembly and the laminate structure is attached to other elements of the HSA.

Laminate structure embodiments include interconnect assemblies, interconnect-suspension assemblies, and gimbal-interconnect assemblies. Interconnect assemblies attach to a load beam and include at least one conductive trace. The second layer provides dielectric insulation and the third layer can include support and stiffening plates.

Interconnect-suspension assemblies include an interconnect assembly and a suspension assembly including a gimbal and a load beam having a rigid region and a spring region. The gimbal can be formed out of the first layer, the third layer, or both. The spring region of the load beam can also be formed out of either or both layers.

A interconnect-suspension assembly embodiment has a first layer of stainless steel, a thin second layer of polyimide, and a third layer of beryllium copper. The first layer has a planar load beam plate including a rigid region. The third layer has at least one trace for electrical coupling to the head assembly, each trace including a gimbal region at a distal end portion and a load beam region at a proximal end portion. The gimbal region is shaped to form gimbal longitudinal arms. The second layer has at least one panel, the panels placed in between and insulating overlapping areas of the first layers and the third layer from each other.

DETAILED DESCRIPTION OF THE INVENTION

Figure 1:
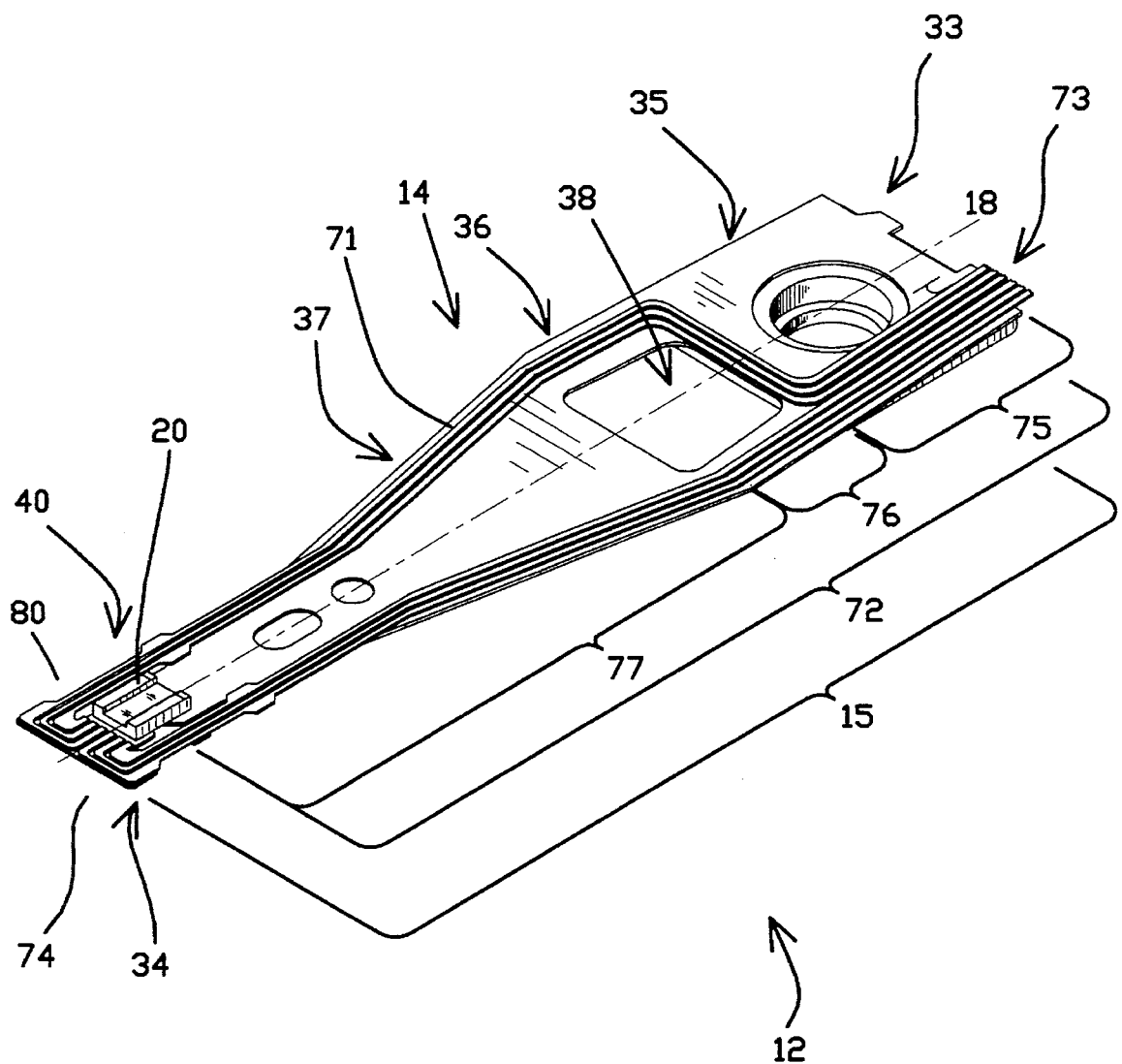
FIG. 1 is a perspective view of a head suspension assembly in accordance with the present invention.
Figure 2:
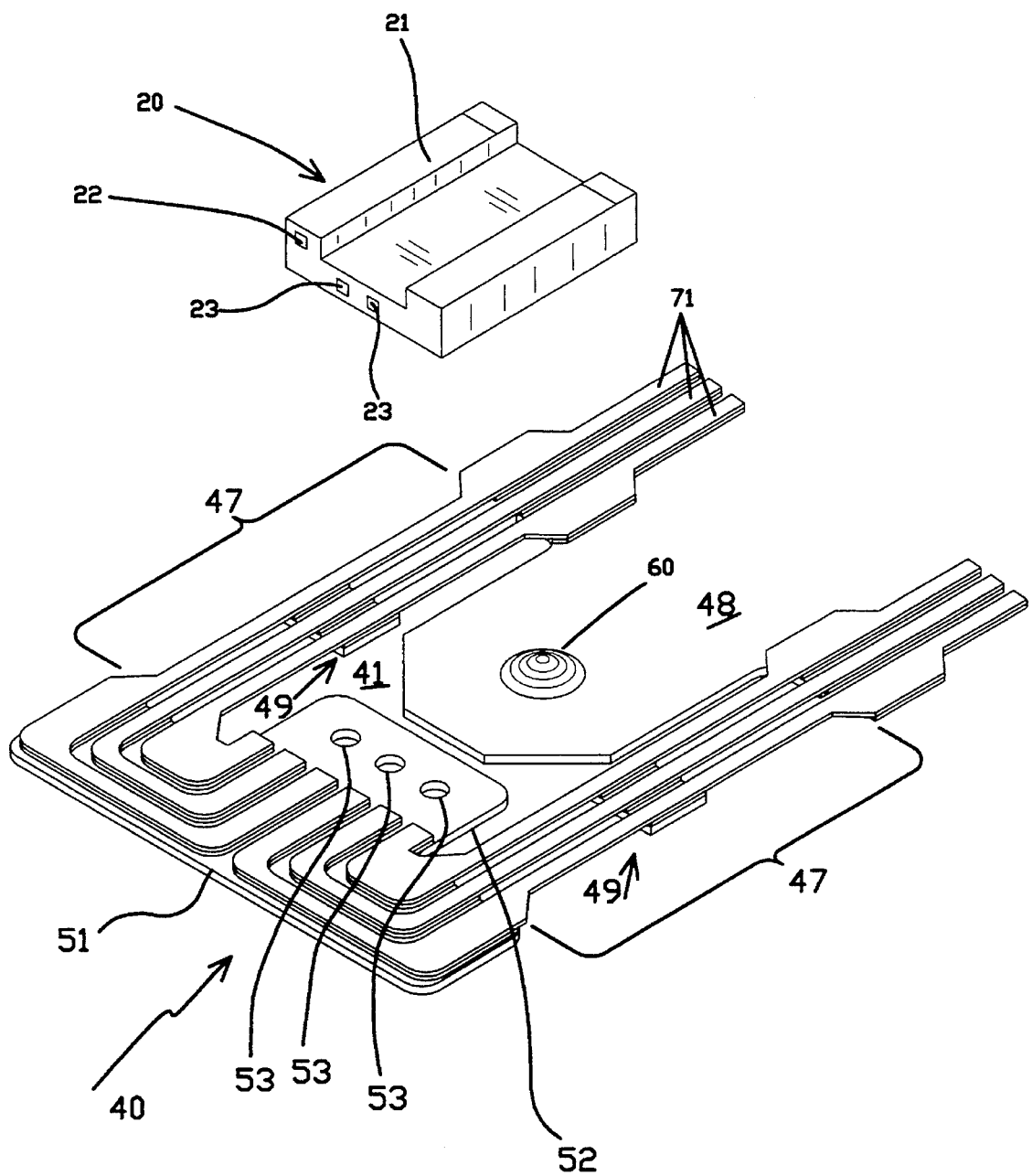
FIG. 2 is a detail enlarged view of the gimbal of the head suspension assembly shown in FIG. 1.
Figure 3:
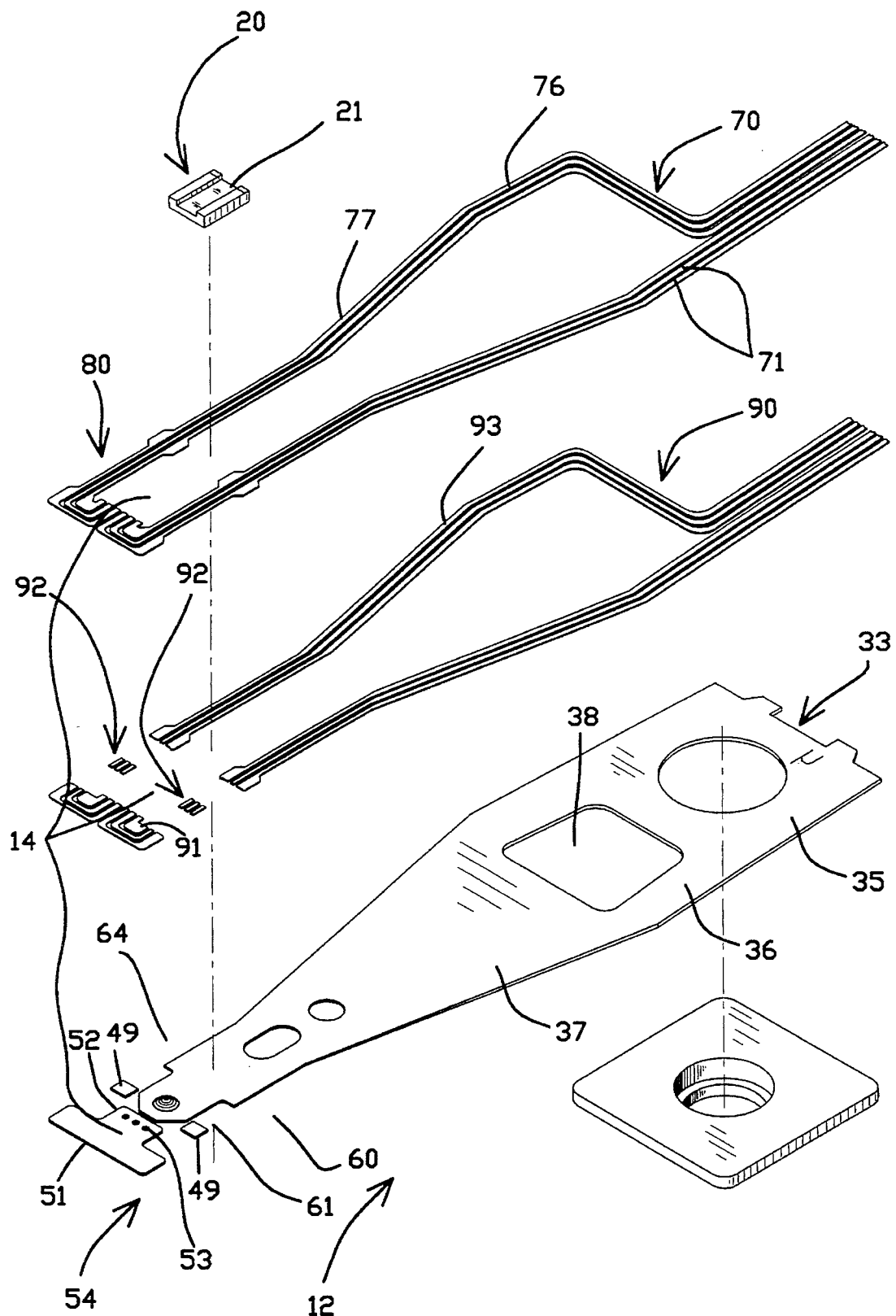
FIG. 3 is an exploded perspective view of the suspension assembly shown in FIG. 1 wherein the exposed areas of the second layer have been etched away.

FIGS. 1–3 show a HSA 12 manufactured in accordance with the present invention aligned with longitudinal axis 18. HSA 12 includes an interconnect-suspension assembly region 14 and a head assembly 20 attached to a distal end of the interconnect-suspension assembly 14. Interconnect-suspension assembly 14 comprises a load beam, an electrical signal interconnect assembly 15, and a gimbal region 40.

Suspension assembly 14 includes a proximal end 33, a distal end 34, a base region 35 adjacent the proximal end 33, a rigid region 37, and a spring region 36 intermediate base region 35 and rigid region 37. Spring region 36 has a spring aperture 38, the relative dimensions of which may be selected to tailor the stiffness of the spring region 36.

Interconnect assembly 15 comprises six conductive electrical traces 71 extending the length of the suspension assembly 14 and insulation regions 91, 92 and 93 as shown in FIG. 3, and suitable electrical circuit connection means as shown, for example, in FIGS. 21–23 of previously identified application Ser. No. 08/249,117 which is incorporated herein by reference (other embodiments can include connector means known in the art).

Traces 71 are elongated and resilient pre-patterned electrical conductors that connect electrical signals from the head assembly 20, along the HSA and beyond its proximal end to amplifying and control electronics (not shown). The traces 71 include a proximal end 73 and a region 74 adjacent the distal end of the load beam. The width and the thickness of traces 71 can be varied at or within the different regions to affect the mechanical stiffness of the trace and/or to change its electrical resistance.

The load beam includes a proximal base region 75, a middle or spring region 76, and a distal, rigid region 77. In the present embodiment, the gimbal region 80 of trace 71 functions as an element of gimbal assembly 40. The mechanical and electrical properties of the BeCu alloys used for traces 71 allow the third layer 70 to act not only as electrical conductors in the electrical interconnect assembly, but also as a mechanical spring elements. The present interconnect assembly 15 acts as both an electrical interconnect assembly and as a mechanical gimbal spring, and it is therefore referred to as an integrated gimbal-interconnect assembly.

In the present embodiment, the rigid regions 77 of the traces 71 also act as stiffening reinforcement regions that give added rigidity to the rigid region 37 of the interconnect-suspension assembly 14 thereby modifying the resonance response of the interconnect-suspension assembly. In the embodiment shown, the rigid regions 77 of traces 71 act as stiffening for the rigid region 37 without the need for either the rails or flanges that are customarily used in the prior art load beams for that purpose. In other applications both stiffening traces and reinforcing rails or flanges may be used to achieve the desired performance characteristics for the suspension.

The thickness and/or width of the rigid region 77 of the traces 71 can be increased to increase their stiffness while reducing also their electrical resistance. In FIG. 1, the traces 71 extend slightly past the proximal end 33 of the HSA 12. The traces 71 can either extend all the way back to amplifying and processing circuitry placed on the actuator arm (not shown) or on the frame of the disk drive (also not shown) or can be connected to an intermediate wiring harness as may be desired.

FIG. 2 shows a detail enlarged view of gimbal 40 with slider 21 shown in an exploded view arrangement. The gimbal assembly disclosed herein differs from the integrated one-piece, torsionally suspended gimbal shown in previously identified application Ser. No. 08/249,117 in that it resembles a "Watrous type" gimbal with the slider mounted on a so called "T flexure" where the slider is attached to a tongue which is pivotally suspended at one end from a cross bar interconnecting the distal ends of a pair of parallel fingers straddling the tongue in a central cutout region.

Gimbal 40 provides gimballing support to the head assembly 20. It mechanically maintains head assembly 20 correctly oriented with respect to and optimally spaced from the recording surface of the rotating disk, regardless of the movements and twists experienced by the suspension assembly 14 during actuator motion or minor variations in the topography of the disk surface.

In the embodiment of the invention disclosed herein, gimbal 40 includes a pair of parallel flexible outer fingers 47 which enclose two sides of an aperture 41. In the embodiment shown, each of the flexible outer fingers 47 is itself comprised of a group of conductive traces. In conventional Watrous type suspensions, the T flexure portion is manufactured as a separate piece that is usually welded or otherwise permanently bonded to the load beam. Such conventional Watrous flexures are stamped or etched to define the pair of parallel fingers that enclose a central aperture. In such a prior art flexure structure, the slider is mounted on a tongue pivotally movable about a supporting pitch axis hinge and which projects into the aperture between the parallel fingers from a cross leg which is connected between the distal ends of the parallel fingers. In the prior art flexure structure, the footprint of the slider is generally substantially bigger that the flexure. Specifically the slider extends over the entirety of the width of the aperture and the parallel outer fingers so that it is therefore necessary to form the slider to offset the plane of the central tongue so that it is displaced above the plane of the fingers and the remainder of the slider and the load beam.

In the embodiment of the invention disclosed herein, the gimbal 40 not only performs a mechanical function similar to that of a Watrous flexure but also performs electrical functions not contemplated in the prior art and therefore has a quite different overall construction. For example, in the present invention, there is no separate flexure structure that is required to be welded to the load beam. Instead, the portion of the lead traces 71 that span the length of the suspension assembly 14 are extended from the distal end of suspension assembly 14 to serve mechanically in the flexure region as a pair of parallel fingers 47.

The parallel fingers 47 of leads 71 each have a thickness and overall cross-section to serve, in the aggregate, the same mechanical spring function as the sheet metal fingers would in the conventional Watrous flexure.

As can be seen particularly in FIG. 2, parallel fingers 47 are not supported by the sheet material of the distal apex 48 of the main structure of suspension assembly 14. They may or may not have a layer of dielectric material such as 90, 91 or 92 on them in the flexure region. In the embodiment shown in FIGS. 1 through 3 herein, there is no dielectric material on the unsupported portions of the parallel fingers 47 of the conductive traces 71 in the region of gimbal 40.

It can also bee seen in FIG. 2 that the width or the cross sectional area of the lead traces 71 is increased at the distal apex of the suspension assembly 14 to provide additional strength in the transition region between where the lead 71 is supported by suspension assembly 14 and where it acts as an unsupported flexure parallel finger 47.

In order to further improve the lateral stiffness of the flexure and the overall suspension, lateral stiffness improving islands 49 are shown as part of the structure of the parallel fingers 47. The islands are made from the same material as the structural load beam, stainless steel alloy, generally having the same thickness as the load beam and also having a dielectric coating which is intermediate the stainless islands 49 and the parallel fingers 47 of the conductive traces 71. The islands 49 are most easily produced as part of the same etching process of the stainless-dielectric-conductor sandwich material that is used to produce the remainder of the suspension.

The cross leg plate 51 is also typically formed from the same initial piece of the stainless steel alloy used to manufacture the remainder of the suspension in accordance with previously identified application Ser. No. 08/249,117. The cross leg plate 51 may have a width less that the full width of the parallel arms 47 or may be of full width as illustrated in FIG. 2.

Slider 21 is securely bonded to a projecting tongue 52 of cross leg plate 51 which may have, as illustrated in FIG. 2, one or more curing holes 53 therein to facilitate the transmission of uv curing radiation to the adhesive used for bonding the slider to the tongue 52 of the cross leg plate 51.

Once the slider 31 is mounted on the tongue 51, the same sorts of wire connection methodologies illustrated in the previously identified application Ser. No. 08/249,117 are used to provide appropriate electrical connections between the terminals 23 of slider 20 and conductive traces 71.

As is the case with the Watrous type suspensions of the prior art, the distal apex portion of the suspension assembly 14 has a load protuberance 60 which, in the embodiment of the invention disclosed in FIGS. 1 through 3 directly engages and bears upon the slider assembly 20 to apply the appropriate loading force through the point through which corresponds to the center of lift of the slider.

In the embodiment disclosed herein, the traces 71 are positioned on the top surface of the suspension. Such an arrangement is particularly suited to interfacing with a slider 20 as disclosed which has its terminal pads 22 and 23 located on the end wall of the slider. Connections to the end wall mounted slider pads are readily made with known bridging connection techniques such as wire bonding.

Alternatively, the trace 71 may be positioned on the other side of the suspension from the one to which it is attached in the embodiment disclosed in FIGS. 1–3. Such an arrangement facilitates the making of connections to sliders configured with terminal pads on their top surface rather than the end walls. In such arrangements the traces may be extended to cover substantially the entire surface of the tongue 52 to facilitate the making of wire bonding bridging connections to the pads on the top surface of the slider.

The invention is not to be taken as limited to all of the details thereof as modifications and variations thereof may be made without departing from the spirit or scope of the invention.

What is claimed is:

1. An integral lead magnetic head suspension for attachment to an actuator arm within a disk drive, said head suspension comprising, in combination:

a load beam including a base region at its proximal end for attachment to an actuator arm, said load beam having plural conductive electrical traces patterned on a surface of said load beam, at least one of the traces being insulated from the surface of said load beam, said traces projecting beyond a distal end of said load beam to form a pair of spaced trace portions extending in a longitudinal direction of said load beam beyond said distal end of said load beam, said load beam also having a load protuberance located thereon adjacent the distal end thereof; and gimbal means having a tongue portion including a slider mounting surface to which a slider is to be mounted, said tongue portion supported for pivotal movement about a pitch axis by a cross leg that is spaced from said distal end of said load beam and interconnecting said pair of spaced trace portions projecting from the distal end of the load beam, at least one of said spaced trace portions being electrically insulated from said cross leg and extending onto said tongue portion, said spaced trace portions aligned with and displaced outwardly from a longitudinal axis of the load beam so that a head slider, when mounted on said slider mounting surface of the tongue portion is pivotally movable between the spaced trace portions of the gimbal means, said gimbal means further being aligned with said load beam so that the load protuberance of the load beam will engage the head slider when mounted to said tongue portion.

2. The head suspension of claim 1 wherein the conductive electrical traces are patterned on the side of the load beam and the gimbal means as the head slider is to be mounted for facilitating electrical connection of the traces to terminal pads on end walls of the head slider.

3. The head suspension of claim 1 wherein the conductive electrical traces are patterned on the opposite side of the load beam and the gimbal means as the head slider is to be mounted for facilitating electrical connection of the traces to terminal pads on the top surface of the head slider.

4. The head suspension of claim 1 wherein the tongue portion of the gimbal means has at least one aperture therein whereby radiation may be introduced to an adhesive bond to be provided between the head slider and tongue portion to facilitate curing of the adhesive.

5. The head suspension of claim 1 wherein at least one of the spaced trace portions is comprised of two or more traces and lateral stiffness enhancing islands are bonded to and insulated from adjacent traces for increasing the lateral stiffness of the gimbal means.

6. The head suspension of claim 1 wherein the cross sectional area of one or more of the electrical traces is increased adjacent the distal end of the load beam.

* * * * *